(12) United States Patent
Sen

(10) Patent No.: US 6,252,760 B1
(45) Date of Patent: Jun. 26, 2001

(54) DISCRETE SILICON CAPACITOR

(75) Inventor: Bidyut Sen, Milpitas, CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/320,241

(22) Filed: May 26, 1999

(51) Int. Cl.[7] .................................................. H01G 4/228
(52) U.S. Cl. ..................... 361/306.3; 361/306.1; 257/690
(58) Field of Search .............................. 361/301.4, 303, 361/306.1, 306.3, 311–313; 257/298, 300, 303, 306, 308, 324, 690

(56) References Cited

U.S. PATENT DOCUMENTS

| | | | |
|---|---|---|---|
| 5,774,326 | * | 6/1998 | McConnelee .................. 361/313 |
| 5,874,770 | * | 2/1999 | Saia et al. ..................... 257/536 |
| 6,025,226 | * | 2/2000 | Gambino et al. .............. 438/244 |

\* cited by examiner

*Primary Examiner*—Anthony Dinkins
(74) *Attorney, Agent, or Firm*—Sierra Patent Group, Ltd.

(57) ABSTRACT

A capacitor, including a substrate, a first interconnect layer disposed upon the substrate and a first insulating layer disposed on the first interconnect layer. A first metal layer is disposed on the first insulating layer and formed as at least two regions, the at least two regions of the first metal layer connected to the first interconnect layer through vias. A second insulating layer is disposed on the first metal layer. A second metal layer is disposed on the second insulating layer and is formed as at least two regions. The capacitor further includes a third insulating layer disposed on the second metal layer, a second interconnect layer disposed on the third insulating layer and connecting to the at least two regions of the second metal layer through vias. Finally, a first terminal is connected to the first interconnect layer and a second terminal is connected to the second interconnect layer.

4 Claims, 3 Drawing Sheets

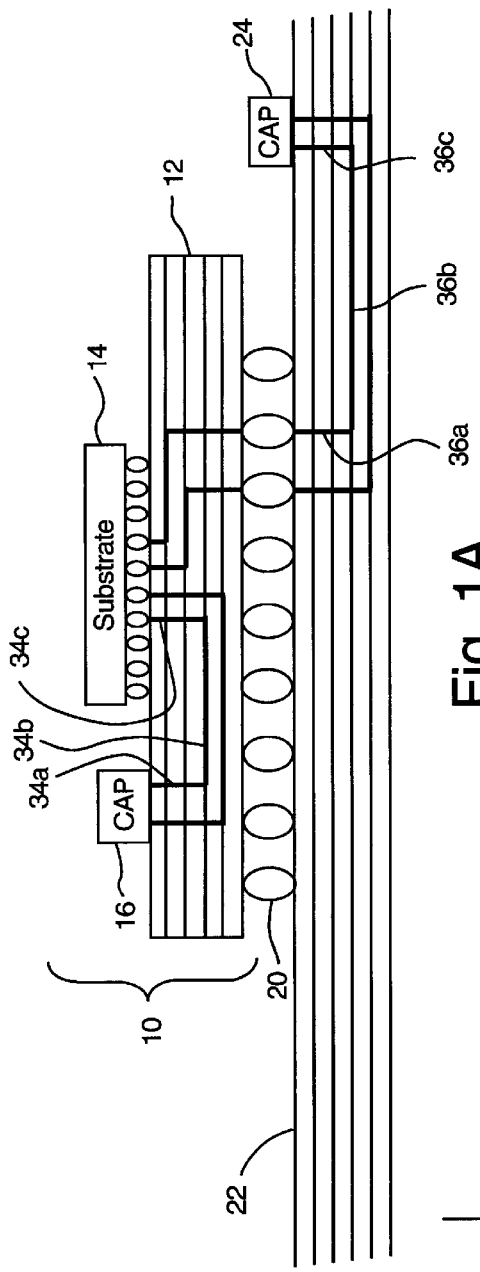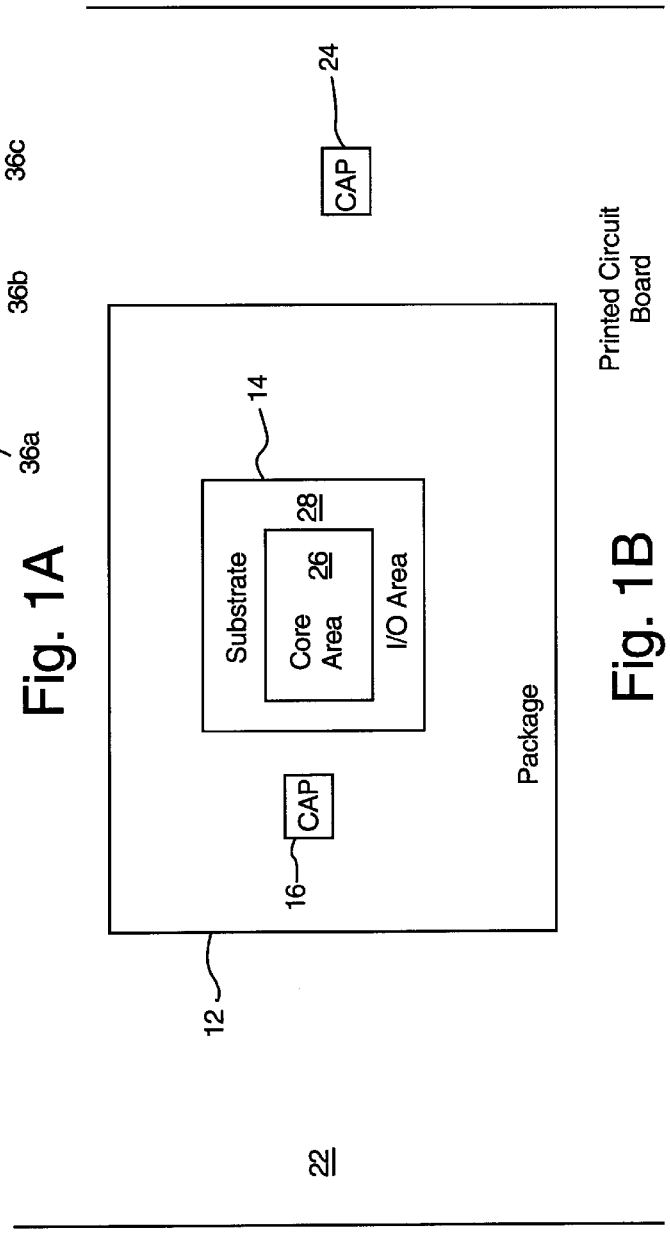

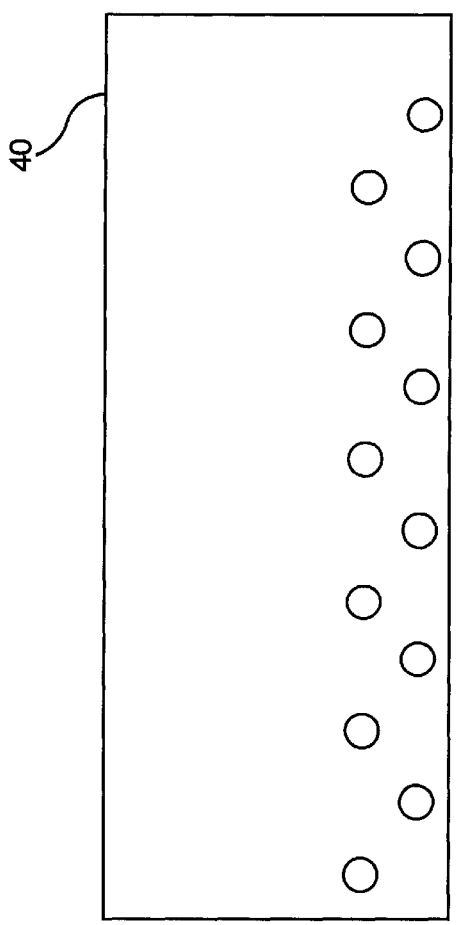
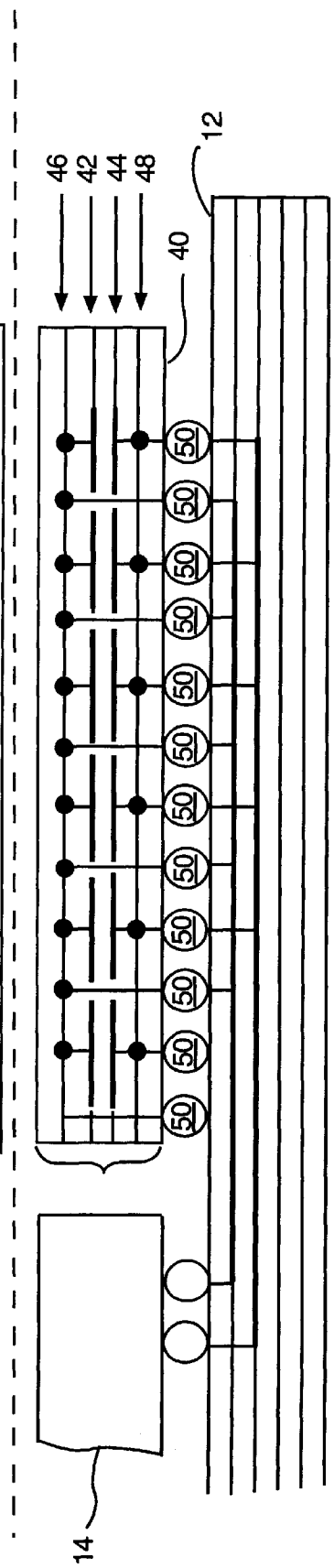

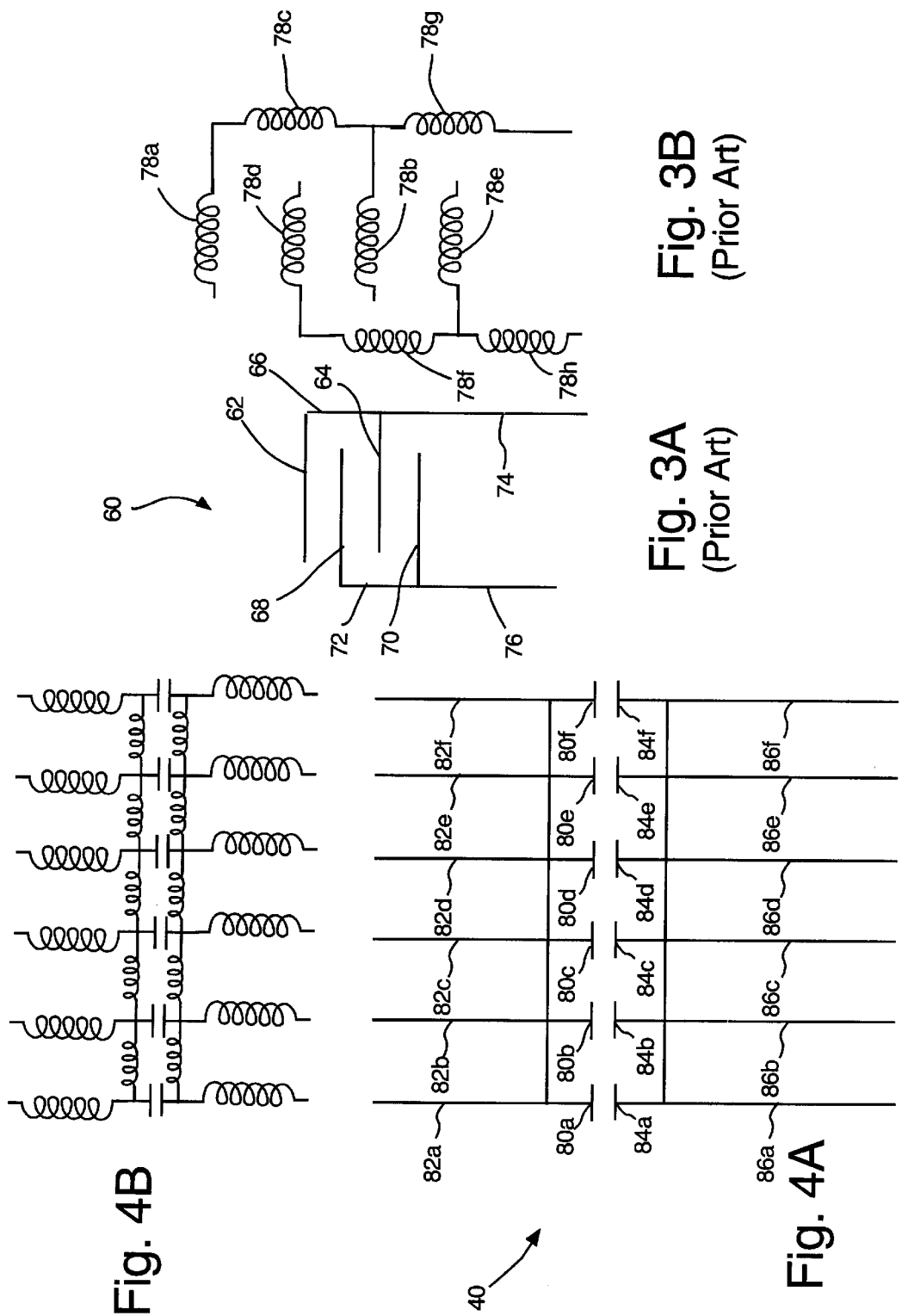

DISCRETE SILICON CAPACITOR

BACKGROUND OF THE INVENTION

1. Field of the Invention

The present invention relates to capacitors. More particularly, the present invention relates to capacitors formed from two metal layers on a substrate.

2. The Background Art

Due to strong market demand for higher integrated circuit data throughputs, there is a constant push to increase signal frequencies used within modern integrated circuits.

In order to ensure that a signal being transmitted over a given conductive path within an integrated circuit are not affected by signals inductively coupled from other conductive paths, capacitors are often added in signal paths so that the amplitudes of those coupled signals are reduced, due to the reactance of the capacitor. The value of the capacitor is chosen so that desirable signals at particular frequencies pass through the capacitor with significantly less reduction in amplitude as compared to the amplitude reduction which occurs to undesirable signals at other frequencies.

FIGS. 1A and 1B are a side view and top view respectively of an integrated circuit substrate mounted on a package, with the resulting combination being mounted on a printed circuit board.

Referring to FIGS. 1A and 1B, integrated circuit 10 is shown including a multilayer package 12, a substrate 14, and a capacitor 16. Solder bumps 18 connect substrate 14 to package 12. Solder bumps 20 connect package 12 to multilayer circuit board 22. Two conductive paths connect substrate 14 to capacitor 16, and two other conductive paths connect substrate 14 to capacitor 24.

In an integrated circuit, there are typically two types of connections made to a substrate. First, there are input/output (I/O) connections which typically connect the substrate to external environment signal sources and signal destinations. Second, there are core connections which provide connections between internal substrate circuits and components such as capacitors and resistors. Core connections have no external signal sources or signal destinations associated with them, and are typically centered on the substrate, completely surrounded by I/O connections.

Capacitors 16 and 24 are provided as examples of components designed into a system for the purpose of filtering signal frequencies from a conductive path. Although these capacitors function properly for their intended purpose, the conductive paths between the substrate and each of capacitors 16 and 24 have a characteristic high inductance which inhibits the use of high signal frequencies.

It is well known in the art that inductances impede the passage of signals at higher frequencies, and capacitances impede the passage of signals at lower frequencies. Two possibilities exist for reducing impedances.

First, the impedance of the signal path may be reduced as disclosed in U.S. patent application Ser. No. 09/320,240, entitled "Peripheral Core Bumps for low inductance paths for Chip Capacitors" naming Bidyut Sen as inventor, filed May 26, 1999, and assigned to Sun Microsystems, Inc., the application being incorporated herein by reference in its entirety.

Second, the inductances associated with the capacitors themselves may be reduced. Prior art capacitors have undesirably high impedances associated with them which, if eliminated or reduced, would allow higher signal frequencies to pass at desirable signal levels.

It would therefore be beneficial to provide a capacitor which reduces the inherent inductance while maintaining or increasing the capacitance.

SUMMARY OF THE INVENTION

A capacitor is disclosed herein, including a substrate, a first interconnect layer disposed upon the substrate and a first insulating layer disposed on the first interconnect layer. A first metal layer is disposed on the first insulating layer and formed as at least two regions, the at least two regions of the first metal layer connected to the first interconnect layer through vias. A second insulating layer is disposed on the first metal layer. A second metal layer is disposed on the second insulating layer and is formed as at least two regions. The capacitor further includes a third insulating layer disposed on the second metal layer, a second interconnect layer disposed on the third insulating layer and connecting to the at least two regions of the second metal layer through vias. Finally, a first terminal is connected to the first interconnect layer and a second terminal is connected to the second interconnect layer.

BRIEF DESCRIPTION OF THE DRAWINGS

FIGS. 1A and 1B are a side view and top view respectively of an integrated circuit substrate mounted on a package, with the resulting combination being mounted on a printed circuit board.

FIG. 2A is a side view of the present invention capacitor mounted on package 12. FIG. 2B is a top view of the present invention capacitor showing one arrangement of external connections.

FIGS. 3A and 3B depict a circuit model for a prior art capacitor.

FIGS. 4A and 4B depict a circuit model for a present invention capacitor.

DETAILED DESCRIPTION OF ONE EMBODIMENT

Those of ordinary skill in the art will realize that the following description of the present invention is illustrative only and not in any way limiting. Other embodiments of the invention will readily suggest themselves to such skilled persons who are familiar with this disclosure.

The present invention provides a discrete capacitor formed using a silicon substrate having two metal layers, with each metal layer having multiple connections to the external environment. By providing multiple connections, the inductances associated with the "leads" of the capacitor are all in parallel, thus significantly reducing the overall inductive effect of the capacitor on the circuit with which it is associated. Further, since the capacitances are also in parallel, the capacitance-of the present invention capacitor is increased over prior art capacitors.

FIG. 2A is a side view of the present invention capacitor mounted on package 12. FIG. 2B is a top view of the present invention capacitor showing one arrangement of external connections.

Referring now to FIG. 2A there is shown an exemplary example of capacitor 40 of the present invention. Capacitor 40 comprises: a first interconnect layer 48 disposed upon a substrate 40; a first insulating layer 43 disposed on the first interconnect layer 48; a first metal layer 44 formed as at least two regions as illustrated by 44a through 44f; at least two vias 45a through 45f formed through the first insulating layer 43 connecting the first metal layer 44 to first interconnect layer 48; a second insulating layer 47 disposed on the first metal layer 42; a second metal layer 42 formed in at least two regions as illustrated as 42a through 42e, disposed on the second insulating layer 47; a third insulating layer 49 disposed on said second metal layer 42; a second interconnect layer 46 disposed on the third insulating layer 49; at least two vias 45g through 45l formed in the second insulating layer 47 and third insulating layer 49 thereby electrically connecting the second metal layer 42 with the second interconnect layer 46; terminals 49a through 49d.

Those of ordinary skill in the art are readily aware that single capacitances are additive when connected in parallel, and inductances are reduced when connected in parallel. As can be seen from the figure, individual capacitors formed within capacitor 40 are in parallel making the associated capacitances additive. Similarly, the inductances associated with the various interconnect conductors are also in parallel, thus causing the total resulting inductance to be small.

It is well known by those of ordinary skill in the art that capacitive reactance is inversely proportional to capacitance. That is, the reactance of a capacitor decreases, at a given frequency, for larger capacitances. It is also well-known that inductive reactances are directly proportional to inductance. Therefore, at a given frequency, the inductive reactance of system decreases if the inductance is minimized. Using these properties, higher signal frequencies are possible with present invention capacitors due to inductive reactance being lower for a given capacitance. Smaller capacitors are required due to the increased capacitance available using the present invention.

FIGS. 3A and 3B depict a circuit model for a prior art capacitor.

Referring to FIG. 3A, a typical prior art capacitor 60 includes a first pair of plates 62 and 64 connected together by conductor 66, and a second pair of plates 68 and 70 connected together by conductor 72. Conductors 74 and 76 connect the first and second pairs of plates to the external environment.

Referring to FIG. 3B, inductances associated with the first and second set of plates are shown. Thus, inductors 78a through 78h represent plates 62 and 64, conductor 66, plates 68 and 70, conductor 72 and leads 74 and 76 respectively. As can be seen from the figure, prior art capacitors have the associated inductors in series. Since inductances in series are additive, the total inductance of the prior art capacitor is higher than if the inductors were in parallel.

FIGS. 4A and 4B depict a circuit model for a present invention capacitor.

Referring to FIG. 4A, present invention capacitor 40 includes a first set of plates 80a through 80f coupled to a first set of conductors 82a through 82f, and a second set of plates 84a through 84f coupled to a second set of leads 86a through 86f.

Referring to FIG. 4B, the inductances associated with most of the conductors and interconnects have been shown. The key to the present invention is that the capacitances are in parallel, and associated inductances are also in parallel, thus providing an ideal environment for the transmission of high frequency signals.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A capacitor comprising:

a substrate;

a first interconnect layer disposed upon said substrate;

a first insulating layer disposed upon said first interconnect layer;

a first metal layer disposed upon said first insulating layer and formed as at least two regions, said at least two regions of said first metal layer connected to said first interconnect layer through vias formed in said first insulating layer;

a second insulating layer disposed upon said first metal layer;

a second metal layer disposed on said second insulating layer and formed as at least two regions;

a third insulating layer disposed on said second metal layer; a second interconnect layer disposed on said third insulating layer and connecting to said at least two regions of said second metal layer through vias formed in said second insulating layer;

at least one first terminal connected to said first interconnect layer; and at least one second terminal connected to said second interconnect layer.

2. The capacitor of claim 1 wherein said substrate is a p-type silicon substrate.

3. The capacitor of claim 1 wherein said substrate is an n-type silicon substrate.

4. The capacitor of claim 1 wherein said first and said second insulating layers comprise silicon dioxide.

* * * * *

UNITED STATES PATENT AND TRADEMARK OFFICE
Certificate

Patent No. 6,252,760                                                                                  Patented: June 26, 2001

On petition requesting issuance of a certificate for correction of inventorship pursuant to 35 U.S.C. 256, it has been found that the above identified patent, through error and without deceptive intent, improperly sets forth the inventorship.

Accordingly, it is hereby certified that the correct inventorship of this patent is: Bidyut Sen, Milpitas, CA; Vidyasagar Ganesan, Palo Alto, CA; Jeffrey Kaskey, Livermore, CA; and Steven Boyle, Palo Alto, CA.

Signed and Sealed this Second Day of April 2002.

*DEAN A. REICHARD*
*Supervisory Patent Examiner*
Art Unit 2831